(12) United States Patent
Hegde

(10) Patent No.: US 9,343,422 B2
(45) Date of Patent: May 17, 2016

(54) STRUCTURE FOR ALUMINUM PAD METAL UNDER BALL BOND

(71) Applicant: Rama I. Hegde, Austin, TX (US)

(72) Inventor: Rama I. Hegde, Austin, TX (US)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 115 days.

(21) Appl. No.: 14/230,274

(22) Filed: Mar. 31, 2014

(65) Prior Publication Data

US 2015/0279809 A1    Oct. 1, 2015

(51) Int. Cl.
| H01L 23/48 | (2006.01) |
| --- | --- |
| H01L 23/52 | (2006.01) |
| H01L 29/40 | (2006.01) |
| H01L 23/00 | (2006.01) |

(52) U.S. Cl.
CPC ............. *H01L 24/49* (2013.01); *H01L 24/48* (2013.01); *H01L 2224/05624* (2013.01); *H01L 2224/45015* (2013.01); *H01L 2224/45144* (2013.01); *H01L 2224/45147* (2013.01); *H01L 2224/85399* (2013.01); *H01L 2924/00014* (2013.01); *H01L 2924/01013* (2013.01); *H01L 2924/01029* (2013.01); *H01L 2924/01079* (2013.01)

(58) Field of Classification Search
CPC ................................. H01L 24/09; H01L 24/49
USPC ......................................................... 257/784
See application file for complete search history.

(56) References Cited

U.S. PATENT DOCUMENTS

| 5,060,051 | A | * | 10/1991 | Usuda | H01L 23/53223 257/765 |
| --- | --- | --- | --- | --- | --- |
| 5,172,212 | A | * | 12/1992 | Baba | H01L 23/53223 257/738 |
| 5,428,251 | A | * | 6/1995 | Naito | H01L 23/53214 257/765 |
| 5,492,263 | A | * | 2/1996 | Webster | B23K 20/004 205/258 |
| 5,654,203 | A | | 8/1997 | Ohtani et al. | |
| 6,208,016 | B1 | * | 3/2001 | Farrar | H01L 21/76802 257/642 |
| 8,247,911 | B2 | | 8/2012 | Uno et al. | |
| 2010/0258954 | A1 | * | 10/2010 | Andoh | H01L 23/49811 257/784 |
| 2011/0260307 | A1 | * | 10/2011 | Schneegans | H01L 23/3735 257/676 |
| 2013/0175689 | A1 | | 7/2013 | Chuang et al. | |

FOREIGN PATENT DOCUMENTS

JP          04155929  A   *   5/1992

OTHER PUBLICATIONS

Liao, W.B., et al., "Processing and Properties of Cu-base and Co-base Amorphous Wires", 2009 International Conference on Electronic Packaging Technology & High Density Packaging, pp. 906-908.

* cited by examiner

*Primary Examiner* — Meiya Li
*Assistant Examiner* — Peter M Albrecht

(57) ABSTRACT

A semiconductor structure is disclosed, wherein for a certain percentage of a plurality of bonding pads, the bonding pad metal may include a plurality of grains, wherein the plurality of grains may include a bonding grain. The bonding grain may have a width substantially the same as the width of the wire bonded to the bonding pad such that no grain boundaries are present below the wire bond.

18 Claims, 2 Drawing Sheets

STRUCTURE FOR ALUMINUM PAD METAL UNDER BALL BOND

BACKGROUND

1. Field

This disclosure relates generally to semiconductor wire bonding, and more specifically, to a structure for aluminum pad metal under ball bond.

2. Related Art

The efficacy of ball bonding has been limited by physical and environmental limitations involved in the ball bonding process. For instance, surface contamination and oxide growth on bond pads may inhibit the rate at which the wire bonds are successfully formed.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

The use of metals in bonding processes for semiconductor structures may require the management of certain physical properties of metals and their use in these processes, such as surface contamination and oxide growth. Further, such management may include other manufacturing processes.

For example, one of the factors reducing the efficacy of ball bonding processes is known as "non stick on pads" or "NSOP." This is a problem wherein a wire may not be successfully bonded to a bond pad. NSOP may result from several factors, including oxide growth, impurities in the metal bond pad, and/or particles on the surface of the metal bond pad (a type of surface contamination).

As the size of the wires and bond pads involved in bonding processes continue to decrease, processing issues will only increase both in scope and complexity. As an example, NSOP issues have risen as the size of the wires and bond pads decrease.

One means of managing the issues involved in wire bonding processes is to manage the structure and/or composition of the bond pad. For example, a bond pad constituted by a number of small grains may decrease the efficacy of a given bonding process. For example, a number of small grains may increase undesirable properties such as surface contamination and oxide growth, particularly at the grain boundaries. Further, with a number of small grains, the number of grain boundaries underneath a ball bond correspondingly increases. Thus, the greater the number of grain boundaries beneath a ball bond, the greater the difficulty in managing the bonding process.

Figure 1:
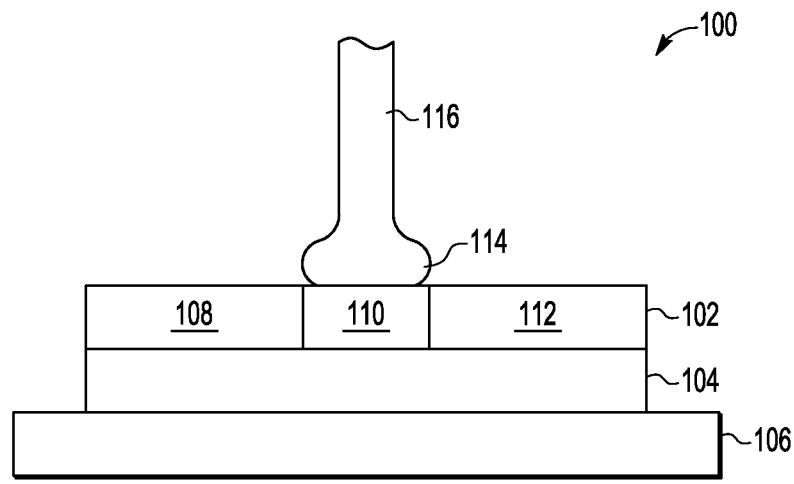
FIG. 1 illustrates a simplified model of an example semiconductor structure including a bond pad comprising a plurality of grains, in accordance with certain embodiments of the present disclosure.

FIG. 1 illustrates a simplified model of an example semiconductor structure 100 including a bond pad 102 comprising a plurality of grains 108, 110, 112, in accordance with certain embodiments of the present disclosure. Semiconductor structure 100 may also include barrier layer 104 between bond pad 102 and substrate 106. In some embodiments, barrier layer 104 may be Titanium Nitride or other appropriate material. In the same or alternative embodiments, substrate 106 may be any semiconductor material or combinations of materials, such as gallium arsenide, silicon germanium, silicon-on-insulator (SOI), silicon, monocrystalline silicon, the like, and combinations of the above.

In some embodiments, semiconductor structure 100 may also include wire 116 bonded to bond pad 102 via wire bond 114. Wire 116 may be formed from any appropriate material, including gold, copper, and/or alloys thereof. Wire bond 114 may be formed by known wire bonding techniques, including thermal bonding. In the same or alternative embodiments, bond pad 102 may be formed of any appropriate material, including aluminum, aluminum-copper alloys, etc.

In some embodiments, bond pad 102 may include a plurality of bond pad grains 108, 110, 112. The plurality of grains may include bonding grain 110. Bonding grain 110 may be structured such that wire 116 is bonded to bonding grain 110 via wire bond 114. In some embodiments, bonding grain 110 may be of a size roughly equivalent to the size of wire 116 and/or wire bond 114. The size of bonding grain 110 may be chosen such that the number of grain boundaries underneath wire bond 114 is reduced and/or eliminated.

For example, wire 116 may be a copper wire with a size (which may also be termed "thickness," "width," or other appropriate terminology) of 8-10 microns. Wire bond 114 bonding wire 116 to bond pad 102 may then have any appropriate size. For example, using conventional techniques, wire bond 114 may be as large as 12-15 microns. Bonding grain 110 may be structured such that it is of a size substantially similar to that of wire bond 114 such that the number of grain boundaries underneath wire bond 114 is reduced and/or eliminated. As a further example, wire 116 may be a copper wire with a size (or width) of five microns. Using conventional wire bonding techniques, wire bond 114 may be as large as eight microns. Bonding grain 110 may be structured such that it is of a size substantially similar to that of wire bond 114 such that the number of grain boundaries underneath wire bond 114 is reduced and/or eliminated.

In some embodiments, bond pad grains 108, 110, 112 may all be the same, substantially the same, and/or different sizes from one another. For example, bond pad 102 may be structured such that it includes only one relatively large grain: bonding grain 110. As an additional example, bond pad 102 may be structured such that each of the grains comprising bond pad 102 are the same (or substantially the same) size. The relative sizes of bond pad grains 108, 110, 112 may be driven by design considerations such as the granularity of the grain size selection process, cost of such a process, and/or an optimization of grain boundaries.

Figure 2:
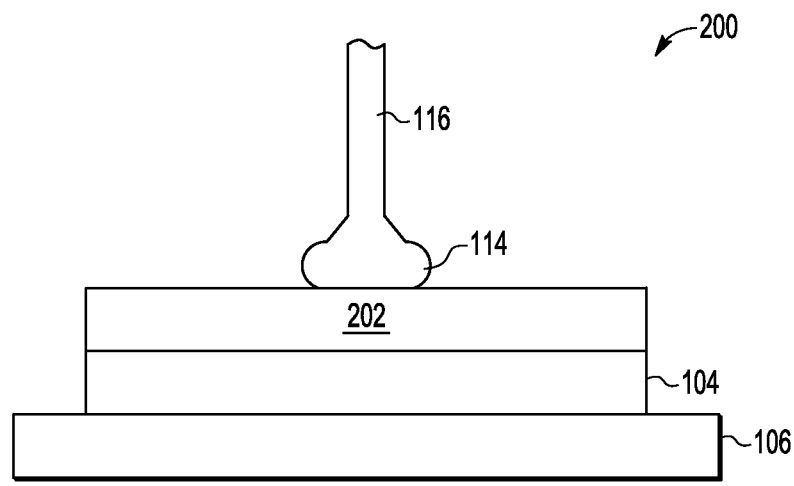
FIG. 2 illustrates a simplified model of an example semiconductor structure including a bond pad comprising a layer of substantially amorphous bonding metal, in accordance with certain embodiments of the present disclosure.

In some embodiments, individual bond pad grains 108, 110, 112 may be eliminated altogether in order to eliminate the number of grain boundaries underlying wire bond 114. FIG. 2 illustrates a simplified model of an example semiconductor structure 200 including a bond pad 202 comprising a layer of substantially amorphous bonding metal, in accordance with certain embodiments of the present disclosure. Semiconductor structure 200 may also include barrier layer 104 between bond pad 202 and substrate 106. In some embodiments, barrier layer 104 may be Titanium Nitride or other appropriate material. In the same or alternative embodiments, substrate 106 may be comprised wholly and/or partially of silicon, doped silicon, and/or other appropriate material.

In some embodiments, semiconductor structure 200 may also include wire 116 bonded to bond pad 202 via wire bond 114. Wire 116 may be formed from any appropriate material, including gold, copper, and/or alloys thereof. Wire bond 114 may be formed by known wire bonding techniques, including thermal bonding. In the same or alternative embodiments, bond pad 202 may be formed of any appropriate material, including aluminum, aluminum-copper alloys, etc.

In some embodiments, bond pad 202 may include a layer of substantially amorphous bonding metal. For example, bond pad 202 may be formed from a layer of amorphous aluminum, amorphous aluminum-copper alloys, etc. This may result in an elimination of grain boundaries underneath wire bond 114 due to the amorphous nature of the bonding metal. The use of an amorphous bonding metal layer may be able to accommodate any appropriate size (or width) of wire 116 and/or wire bond 114.

In some embodiments, a given semiconductor structure may include some wire bonds including a large grain section (e.g., as described in more detail above with reference to FIG. 1), and/or an amorphous section (e.g., as described in more detail above with reference to FIG. 2) alongside sections of the semiconductor structure formed with traditional bond pad techniques (and corresponding grain sizes).

Figure 3:
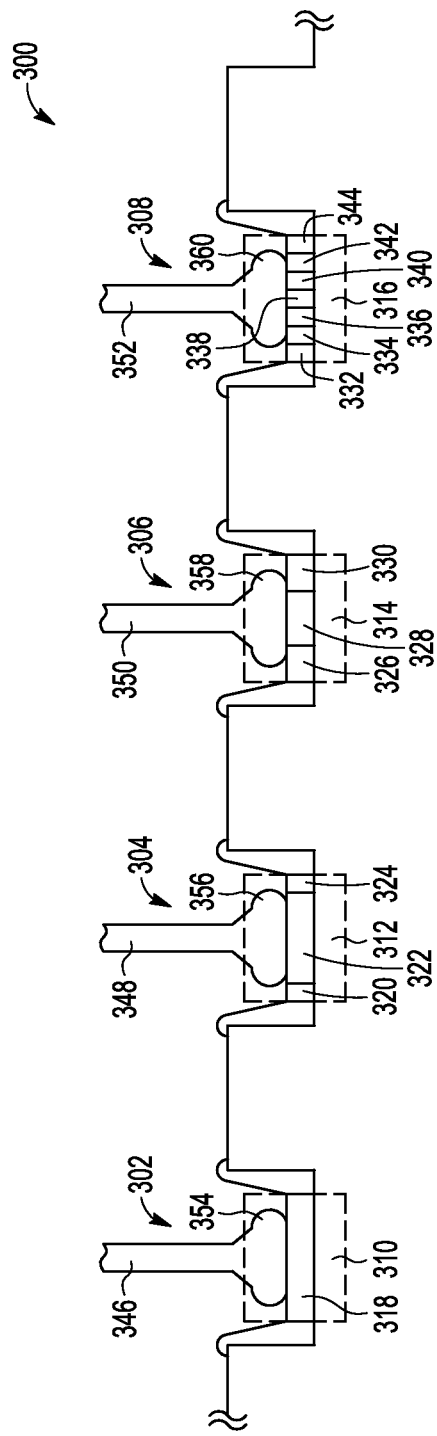
FIG. 3 illustrates a simplified cross-section of a semiconductor structure including bonding regions, in accordance with certain embodiments of the present disclosure.

FIG. 3 illustrates a simplified cross-section of a semiconductor structure 300 including bonding regions 302, 304, 306, 308, in accordance with certain embodiments of the present disclosure. Although four bonding regions 302, 304, 306, 308 are illustrated, more, fewer, and/or different bonding regions may be present within semiconductor structure 300 without departing from the scope of the present disclosure. Further, although certain types of bonding regions are presented in a certain order to aid in clarity and understanding, one of ordinary skill in the art would understand that other configurations of semiconductor structure 300 may be possible without departing from the scope of the present disclosure.

In some embodiments, semiconductor structure 300 may include bonding regions 302, 304, 306 with reduced and/or eliminated grain boundaries, as well as bonding region 308, formed without regard to grain boundaries. In some configurations of semiconductor structure 300, only a percentage of bonding regions may be formed with regard to the grain boundaries underlying a particular wire bond. The percentage may be based on other design considerations, including without limitation cost, size, design purpose, etc. For example, the portion of semiconductor structure 300 for which consideration is given to grain boundaries may range from just over fifty percent (e.g., in a test environment) to close to one hundred percent (e.g., in a development environment). These examples are given only to aid in understanding, and other percentages and/or applications would be possible without departing from the scope of the present disclosure. For example, manufacturing limitations may be such that one hundred percent coverage is not possible, but substantial coverage (e.g., 95%) may be.

In some embodiments, bonding region 302 may be a bonding region structured with regard to grain boundaries. Bonding region 302 may include a bonding area 310. As described in more detail above with reference to FIG. 2, bonding area 310 may include a bonding pad made up of layer of substantially amorphous bonding metal. In such configurations, there may be no grain boundaries present such that there are no grain boundaries underlying wire bond 354 formed in order to bond wire 346 within bonding area 310.

In the same or alternative embodiments, semiconductor structure 300 may also include bonding region 304. Bonding region 304 may include bonding area 312. As described in more detail above with reference to FIG. 1, bonding area 312 may include a bond pad including a plurality of grains 320, 322, 324. At least one such grain (e.g., bonding grain 322) may be structured such that it is of a size substantially similar to that of wire bond 354. In such a configuration, wire bond 356 may be formed on top of bonding grain 322 such that there are no grain boundaries underneath wire bond 356 formed in order to bond wire 348 in bonding area 312. As described in more detail above with reference to FIG. 1, the relative sizes of grains 320, 322, 324 may be somewhat arbitrary, and/or driven by design considerations other than the regard given to grain boundaries.

In the same or alternative embodiments, semiconductor structure 300 may also include bonding region 306. Bonding region 306 may include bonding area 314. As described in more detail above with reference to FIG. 1, bonding area 314 may include a bond pad including a plurality of grains 326, 328, 330. At least one such grain (e.g., bonding grain 328) may be structured such that it is of a size substantially similar to that of wire bond 358. In such a configuration, wire bond 358 may be formed on top of bonding grain 328 such that there are no grain boundaries underneath wire bond 358 formed in order to bond wire 350 in bonding area 314. As described in more detail above with reference to FIG. 1, grains 326, 328, 330 may be the same (or substantially similar) in size.

In the same or alternative embodiments, semiconductor structure 300 may also include bonding region 308. Bonding region 308 may include bonding area 316. Without regard to grain boundaries, bonding area 316 may include any number of grains 332, 334, 336, 338, 340, 342, 344. When bonding wire 352 in bonding area 316, wire bond 360 may have any number of grain boundaries present underneath wire bond 360. Although seven grains are illustrated, more, fewer, and/or different grains may be present within bonding region 308 depending on the techniques used to fabricate bonding region 308. Without regard to grain boundaries, the relatively arbitrary number of grains present within bonding region 308 may result in an increase in undesirable effects, particularly those more prevalent at grain boundaries. This may result in an increase in undesirable process effects, such as NSOP.

By now it should be appreciated that there has been provided structures for aluminum pad metal under a ball bond that may improve management of undesirable properties and/or effects involved in wire bond processes. For example, by reducing and/or eliminating the grain boundaries present below a wire bond, properties corresponding to such grain boundaries (e.g., increased oxide formation and surface contamination, etc.) and their subsequent effects (e.g., NSOP, etc.) may be better managed.

The terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Although the invention is described herein with reference to specific embodiments, various modifications and changes can be made without departing from the scope of the present invention as set forth in the claims below. For example, a semiconductor device may be formed such that no bonding regions are formed without regard to grain boundaries.

Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

In some embodiments, a semiconductor structure (100, 300) may include a plurality of bonding pads (102, bonding pads within bonding areas 312, 314) and a plurality of wires (116, 348, 350), each of the plurality of wires bonded to one of the plurality of bonding pads to form a plurality of wire bonds (114, 356, 358). For a percentage of the plurality of bonding pads, the bonding pad may include a bonding pad metal, and the bonding pad metal may include a plurality of grains (108, 110, 112; 320, 322, 324; 326, 328, 330). In some embodiments, the percentage of the plurality of bonding pads may be greater than fifty percent. The plurality of grains may include a bonding grain (110, 322, 328), the bonding grain having a grain width substantially the same as a wire bond width of a wire bonded to a bonding pad. The wire may be bonded to the bonding pad at the bonding grain such that no grain boundaries are present below a wire bond.

In some configurations of those embodiments, the bonding pad metal may include aluminum. In the same or alternative configurations, the wire may include gold and/or copper.

In other configurations, the plurality of grains may be substantially the same size.

In still other configurations, the grain width and/or the wire bond width may be less than ten microns, and/or less than or equal to five microns.

In further configurations, the percentage of the plurality of bonding pads may be greater than or equal to seventy-five percent. The percentage may also be greater than or equal to ninety percent.

In the same or alternative embodiments, a semiconductor structure may include a plurality of boundary-free bonding pads (202, bond pad within bonding region 310), with each of the plurality of boundary-free bonding pads including a layer of substantially amorphous bonding metal. The semiconductor structure may also include a plurality of wires (116, 346), with each of the plurality of wires bonded to one of the plurality of boundary-free bonding pads to form a plurality of wire bonds (114, 354) such that no grain boundaries are present below a wire bond.

In some configurations of these embodiments, the layer of amorphous bonding metal may include aluminum, amorphous aluminum-copper alloys, etc. In the same or alternative configurations, the wire may include gold and/or copper.

In other configurations, the semiconductor structure may also include a plurality of boundary bonding pads (bonding pad within bonding region 316), each of the plurality of boundary bonding pads bonded to one of a plurality of wires (352) to form a plurality of wire bonds (360) such that grain boundaries are present below a wire bond. The number of boundary bonding pads may be smaller than the number of boundary-free bonding pads. For example, the number of boundary bonding pads may be less than twenty-five percent of the number of boundary-free bonding pads, and/or may be less than or equal to five percent of the number of boundary-free bonding pads.

What is claimed is:

1. A semiconductor structure comprising:
   a plurality of bonding pads;
   a plurality of wires, each of the plurality of wires bonded to a respective one of the plurality of bonding pads to form a plurality of wire bonds; and
   for a percentage of the plurality of bonding pads, each bonding pad in the percentage of the plurality of bonding pads comprises a plurality of grains, wherein:
   the percentage is greater than fifty percent;
   the plurality of grains comprises a bonding grain, the bonding grain having a grain width substantially the same as a width of a corresponding one of the plurality of wire bonds; and
   the corresponding one of the plurality of wire bonds is formed at the bonding grain such that no grain boundaries are present directly below the corresponding one of the plurality of wire bonds.

2. The semiconductor structure of claim 1, wherein each bonding pad in the percentage comprises aluminum.

3. The semiconductor structure of claim 1, wherein the plurality of grains have grain sizes substantially similar.

4. The semiconductor structure of claim 1, wherein the grain width is less than ten microns.

5. The semiconductor structure of claim 1, wherein the grain width is less than or equal to five microns.

6. The semiconductor structure of claim 1, wherein the width of the corresponding one of the plurality of wire bonds is less than ten microns.

7. The semiconductor structure of claim 1, wherein the width of the corresponding one of the plurality of wire bonds is less than or equal to five microns.

8. The semiconductor structure of claim 1, wherein the percentage is greater than or equal to seventy-five percent.

9. The semiconductor structure of claim 1, wherein the percentage is greater than or equal to ninety percent.

10. The semiconductor structure of claim 1, wherein each of the plurality of wires comprises gold.

11. The semiconductor structure of claim 1, wherein each of the plurality of wires comprises copper.

12. A semiconductor structure comprising:
    a plurality of boundary-free bonding pads formed on a semiconductor substrate, each of the plurality of boundary-free bonding pads comprising a layer of substantially amorphous bonding metal;
    a first plurality of wires, each of the first plurality of wires bonded to a respective one of the plurality of boundary-free bonding pads to form a first plurality of wire bonds such that no grain boundaries are present directly below each of the first plurality of wire bonds;
    a plurality of boundary bonding pads formed on the semiconductor substrate, each of the plurality of boundary bonding pads bonded to a respective one of a second plurality of wires to form a second plurality of wire bonds such that grain boundaries are present directly below each of the second plurality of wire bonds; and
    a plurality of structured bonding pads formed on the semiconductor substrate, each of the plurality of structured bonding pads comprising a plurality of grains and bonded to a respective one of a third plurality of wires to form a third plurality of wire bonds, wherein:

the plurality of grains comprises a bonding grain, the bonding grain having a grain width substantially the same as a width of a corresponding one of the third plurality of wire bonds; and the corresponding one of the third plurality of wire bonds is formed at the bonding grain such that no grain boundaries are present directly below the corresponding one of the third plurality of wire bonds.

13. The semiconductor structure of claim 12, wherein the layer of substantially amorphous bonding metal comprises aluminum.

14. The semiconductor structure of claim 12, wherein each of the first plurality of wires, each of the second plurality of wires and each of the third plurality of wires comprises gold.

15. The semiconductor structure of claim 12, wherein each of the first plurality of wires, each of the second plurality of wires and each of the third plurality of wires comprises copper.

16. The semiconductor structure of claim 12, wherein the plurality of boundary bonding pads is smaller in number than the plurality of boundary-free bonding pads.

17. The semiconductor structure of claim 12, wherein the plurality of boundary bonding pads is less than or equal to twenty-five percent of the plurality of boundary-free bonding pads.

18. The semiconductor structure of claim 12, wherein the plurality of boundary bonding pads is less than or equal to five percent of the plurality of boundary-free bonding pads.

* * * * *